(12) United States Patent
Suzuki et al.

(10) Patent No.: US 8,022,414 B2
(45) Date of Patent: Sep. 20, 2011

(54) SILICON CARBIDE SEMICONDUCTOR DEVICE, AND METHOD OF MANUFACTURING THE SAME

(75) Inventors: Naohiro Suzuki, Anjo (JP); Tsuyoshi Yamamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 496 days.

(21) Appl. No.: 12/076,450

(22) Filed: Mar. 19, 2008

(65) Prior Publication Data

US 2008/0230787 A1 Sep. 25, 2008

(30) Foreign Application Priority Data

Mar. 20, 2007 (JP) ................................. 2007-072626

(51) Int. Cl.
*H01L 31/0312* (2006.01)
(52) U.S. Cl. .......... 257/77; 257/262; 257/263; 257/452; 257/E29.019
(58) Field of Classification Search ...... 257/77, 257/262, 263, 452 E29.019
See application file for complete search history.

(56) References Cited

U.S. PATENT DOCUMENTS

| 5,895,939 | A | * | 4/1999 | Ueno ............................ 257/279 |
| 6,342,709 | B1 | | 1/2002 | Sugawara et al. |
| 2007/0007537 | A1 | | 1/2007 | Ogura et al. |

FOREIGN PATENT DOCUMENTS

| EP | 0345380 A2 | 12/1989 |
| JP | A-H01-310576 | 12/1989 |
| JP | A-H05-343691 | 12/1993 |
| JP | A-H06-013621 | 1/1994 |
| JP | H10-098188 | 4/1998 |
| JP | 2001267570 A * | 9/2001 |
| JP | A-2001-267570 | 9/2001 |
| JP | A-2003-318409 | 11/2003 |
| JP | A-2005-340552 | 12/2005 |
| JP | A-2007-013058 | 1/2007 |

OTHER PUBLICATIONS

Office Action dated Oct. 6, 2009 from Japan Patent Office in corresponding JP application No. 2007-072626 (and English translation).
Office Action dated Feb. 24, 2009 in corresponding Japanese patent application No. 2007-072626 (and English translation).
Office Action dated Dec. 2, 2010 from the German Patent and Trademark Office issued in connection with corresponding German patent application No. 10 2008 000 660.2-33 (and English translation).

* cited by examiner

*Primary Examiner* — Jerome Jackson, Jr.
*Assistant Examiner* — Dale E Page
(74) *Attorney, Agent, or Firm* — Posz Law Group, PLC

(57) ABSTRACT

The silicon carbide semiconductor device includes a trench formed from a surface of a drift layer of a first conductivity type formed on a substrate of the first conductivity type, and a deep layer of a second conductivity type located at a position in the drift layer beneath the bottom portion of the trench. The deep layer is formed at a certain distance from base regions of the second conductivity type formed on the drift layer so as to have a width wider than the width of the bottom portion of the trench, and surround both the corner portions of the bottom portion of the trench.

2 Claims, 14 Drawing Sheets

SILICON CARBIDE SEMICONDUCTOR DEVICE, AND METHOD OF MANUFACTURING THE SAME

CROSS-REFERENCE TO RELATED APPLICATION

This application is related to Japanese Patent Application No. 2007-72626 filed on Mar. 20, 2007, the contents of which are hereby incorporated by reference.

BACKGROUND OF THE INVENTION

1. Field of the Invention

The present invention relates to a SiC (Silicon Carbide) semiconductor device including a trench-gate type vertical power device, and a method of manufacturing the same.

2. Description of Related Art

In recent years, SiC has gathered attention because of its use as material in the production of power devices due to its high electric field breakdown strength. SiC having a higher electric field breakdown strength than silicon, makes it possible to control a large current in a power device. For example, SiC semiconductor devices are expected to be used in motor control for a hybrid vehicle.

To pass a further larger current in a power device, it is effective to increase the channel density of the power device. Accordingly, in the field of silicon transistors, trench-gate type vertical power MOSFETs are now in actual use. The trench-gate structure is applicable to SiC transistors. However, in the case of SiC, there is a challenge in using the trench-gate structure as set forth below.

Generally, a SiC transistor in operation is applied with a voltage which is nearly 10 times that applied to a silicon transistor in operation, because SiC has electric field breakdown strength about 10 times higher than that of silicon. Accordingly, the strength of the electric field applied to the gate insulation film on the trench surface in the case of the SiC transistor is also nearly 10 times higher than that in the case of the silicon transistor.

To cope with this, it has been proposed to form, immediately after the trench is formed, a p-type layer at the bottom portion of the trench gate by ion-injection of p-type dopant in manufacturing a trench-gate type MOSFET. For more detail, refer to Japanese Patent Application Laid-open No. 10-98188.

However, the structure disclosed in this patent document cannot prevent destruction of the gate insulation film, because the p-type layer is formed only in the bottom portion of the trench gate, and accordingly, the electric field concentrates on the sides of the bottom portion of the trench gate.

SUMMARY OF THE INVENTION

The present invention provides a silicon carbide semiconductor device including an inverted MOSFET comprising:

a substrate of a first conductivity type made of silicon carbide;

a drift layer of the first conductivity type formed on the substrate, the drift layer being made of silicon carbide, and less doped than the substrate;

a trench formed from a surface of the drift layer;

a pair of base regions of a second conductivity type formed so as to face across from the trench in the drift layer and be in contact with a sidewall of the trench, the base regions being made of silicon carbide;

a pair of source regions of the first conductivity type formed so as to face across from the trench and be in contact with the sidewall of the trench in the drift layer, the source regions being made of silicon carbide, and more highly doped than the drift layer;

a gate insulation film formed on a surface of the trench; a gate electrode formed on the gate insulation film within the trench;

a first electrode electrically connected to the source regions; and a second electrode formed on a back surface of the substrate;

the inverted MOSFET operating such that a channel region is formed in a surface portion of each of the base regions located at the sidewall of the trench, depending on a voltage applied to the gate electrode to allow a current to pass between the first and second electrodes through the source regions and the drift layer, wherein the trench has a tapered shape in which a width of a bottom portion thereof is smaller than a width of an entrance portion thereof located at the surface of the drift layer, and the silicon carbide semiconductor device further comprises a deep layer of the second conductivity type located at a position in the drift layer beneath the bottom portion of the trench, the deep layer being formed at a certain distance from the base regions so as to have a width wider than the width of the bottom portion of the trench and surround both corner portions of the bottom portion of the trench.

The present invention also provides a silicon carbide semiconductor device including an accumulation-mode MOSFET comprising:

a substrate of a first conductivity type made of silicon carbide;

a drift layer of the first conductivity type formed on the substrate, the drift layer being made of silicon carbide, and less doped than the substrate;

a trench formed from a surface of the drift layer;

a pair of base regions of a second conductivity type formed so as to face across from the trench in the drift layer and be in contact with a sidewall of the trench, the base regions being made of silicon carbide;

a pair of source regions of the first conductivity type formed so as to face across from the trench and be in contact with the sidewall of the trench in the base regions, the source regions being made of silicon carbide, and more highly doped than the drift layer;

a channel layer of the first conductivity type formed on a surface of the trench so as to connect between the drift layer and the source regions, the channel layer being made of silicon carbide;

a gate insulation film formed on a surface of the channel layer within the trench;

a gate electrode formed on the gate insulation film within the trench;

a first electrode electrically connected to the source regions; and a second electrode formed on a back surface of the substrate;

the accumulation-mode MOSFET operating such that a channel formed in the channel layer is controlled depending on a voltage applied to the gate electrode to allow a current to pass between the first and second electrodes through the source regions and the drift layer, wherein the trench has a tapered shape in which a width of a bottom portion thereof is smaller than a width of an entrance portion thereof located at the surface of the drift layer, and the silicon carbide semiconductor device further comprises a deep layer of the second conductivity type located at a position in the drift layer beneath the bottom portion of the trench, the deep layer being formed at a certain distance from the base regions so as to have a width wider than the width of the bottom portion of the trench and surround both corner portions of the bottom portion of the trench.

The present invention also provides a silicon carbide semiconductor device including an accumulation-mode MOSFET comprising:

a substrate of a first conductivity type made of silicon carbide;

a drift layer of the first conductivity type formed on the substrate, the drift layer being made of silicon carbide, and less doped than the substrate;

a trench formed from a surface of the drift layer;

a pair of base regions of a second conductivity type formed so as to face across from the trench in the drift layer and be in contact with a sidewall of the trench, the base regions being made of silicon carbide;

a pair of source regions of the first conductivity type formed so as to face across from the trench and be in contact with the sidewall of the trench in the base regions, the source regions being made of silicon carbide, and more highly doped than the drift layer;

a channel layer of the first conductivity type formed on a surface of the trench so as to connect between the drift layer and the source regions, the channel layer being made of silicon carbide;

a gate insulation film formed on a surface of the channel layer within the trench;

a gate electrode formed on the gate insulation film within the trench;

a first electrode electrically connected to the source regions; and a second electrode formed on a back surface of the substrate;

the accumulation-mode MOSFET operating such that a channel formed in the channel layer is controlled depending on a voltage applied to the gate electrode to allow a current to pass between the first and second electrodes through the source regions and the drift layer, wherein the trench is so shaped that the sidewall thereof is perpendicular to the surface of the drift layer, and the base regions are made deeper than the channel layer formed in the trench.

The present invention also provides a silicon carbide semiconductor device including an inverted MOSFET comprising:

a substrate of a first conductivity type, the substrate being made of silicon carbide;

a drift layer of the first conductivity type formed on the substrate, the drift layer being made of silicon carbide, and less doped than the substrate;

a trench formed from a surface of the drift layer;

a pair of base regions of a second conductivity type formed so as to face across from the trench in the drift layer and be in contact with a sidewall of the trench, the base regions being made of silicon carbide;

a pair of source regions of the first conductivity type formed so as to face across from the trench and begin contact with the sidewall of the trench in the drift layer, the source regions being made of silicon carbide, and more highly doped than the drift layer;

a gate insulation film formed on a surface of the trench;

a gate electrode formed on the gate insulation film within the trench;

a first electrode electrically connected to the source regions;

a second electrode formed on a back surface of the substrate;

the inverted MOSFET operating such that a channel region is formed in a surface portion of each the base region located at the sidewall of the trench depending on a voltage applied to the gate electrode to allow a current to pass between the first and second electrodes through the source regions and the drift layer, wherein the trench is so shaped that the sidewall thereof is perpendicular to the surface of the drift layer, and the base regions are made deeper than the trench.

The present invention also provides a silicon carbide semiconductor device including a MOSFET comprising:

a substrate of a first conductivity type, the substrate being made of silicon carbide;

a drift layer 2 of the first conductivity type formed on the substrate, the drift layer being made of silicon carbide, and less doped than the substrate;

a trench formed from a surface of the drift layer;

a pair of base regions of a second conductivity type formed so as to face across from the trench in the drift layer, the base regions being made of silicon carbide;

a pair of source regions of the first conductivity type formed so as to face across from the trench in the drift layer, the source regions being made of silicon carbide, and more highly doped than the drift layer;

a gate insulation film formed on a surface of the trench;

a gate electrode formed on the gate insulation film within the trench;

a first electrode electrically connected to the source regions;

a second electrode formed on a back surface of the substrate;

the MOSFET operating such that a current is allowed to pass between the first and second electrodes through the sidewall of the trench, the source regions and the drift layer depending on a voltage applied to the gate electrode, wherein a deep layer of the second conductivity type is formed in the drift layer and beneath the bottom portion of the trench, the base regions extend deeper than the bottom portion of the trench at a certain distance from the deep layer, and the source regions are located at a certain distance from the trench, a surface channel layer of the first conductivity type is formed on the drift layer and on a surface of each the base region between the source regions and the trench, the gate insulation film and the gate electrode being formed also on the surface channel layer, an accumulation-type region being set in the surface channel layer depending on the voltage applied to the gate electrode.

The present invention also provides a method of manufacturing a silicon carbide semiconductor device comprising the steps of:

forming a drift layer of a first conductivity type on a substrate of the first conductivity type made of silicon carbide, the drift layer being made of silicon carbide, and less doped than the substrate;

forming a deep layer having a predetermined width and a predetermined depth by ion-injecting impurities of a second conductivity type into a predetermined position from a surface of the drift layer;

forming a pair of base regions at both sides of the deep layer by ion-injecting impurities of the second conductivity type into a predetermined position from the surface of the drift layer;

forming a pair of source regions of the first conductivity type on surface portions of the base regions, the source regions being made of silicon carbide, and more highly doped than the drift layer;

forming a trench from the surface of the drift layer such that both corner portions of a bottom portion of the trench are surrounded by the deep layer, the base regions are located at a certain distance from the deep layer, and the trench has a tapered shape in which a width of the bottom portion thereof is smaller than a width of an entrance portion thereof at a side of the surface of the drift layer;

forming a gate insulation film on a surface of the trench;

forming a gate electrode on the gate insulation film within the trench;

forming a first electrode electrically connected to the source regions; and forming a second electrode on a back surface of the substrate.

The present invention also provides a method of manufacturing a silicon carbide semiconductor device comprising the steps of:

forming a drift layer of a first conductivity type on a substrate of the first conductivity type made of silicon carbide, the drift layer being made of silicon carbide, and less doped than the substrate;

forming a deep layer having a predetermined width and a predetermined depth by ion-injecting impurities of a second conductivity type into a predetermined position from a surface of the drift layer;

forming a pair of base regions at both sides of the deep layer by ion-injecting impurities of the second conductivity type into a predetermined position from the surface of the drift layer;

forming a trench from the surface of the drift layer such that both corner portions of a bottom portion of the trench are surrounded by the deep layer, the base regions are located at a certain distance from the deep layer, and the trench has a tapered shape in which a width of the bottom portion thereof is smaller than a width of an entrance portion thereof at a side of the surface of the drift layer; forming an gate insulation film on a surface of the trench;

forming a channel layer of the first conductivity type on a surface of the trench, the channel layer being made of silicon carbide;

forming a gate insulation film on a surface of the channel layer within the trench;

forming a gate electrode on the gate insulation film within the trench;

forming a pair of source regions of the first conductivity type on surface portions of the base regions, the source regions being made of silicon carbide, and more highly doped than the drift layer;

forming a first electrode electrically connected to the source regions; and forming a second electrode on a back surface of the substrate.

The present invention also provides a method of manufacturing a silicon carbide semiconductor device comprising the steps of:

forming a drift layer of a first conductivity type on a substrate of the first conductivity type made of silicon carbide, the drift layer being made of silicon carbide, and less doped than the substrate;

forming a deep layer having a predetermined width and a predetermined depth, and pair of base regions at both sides of the deep layer and at a certain distance from the deep layer such that the deep layer and the base regions have the same depth by ion-injecting impurities of a second conductivity type into a predetermined position from a surface of the drift layer;

forming a trench from the surface of the drift layer such that both corner portions of a bottom portion of the trench are surrounded by the deep layer, the base regions are located at a certain distance from the deep layer, and the trench has a tapered shape in which a width of the bottom portion thereof is smaller than a width of an entrance portion thereof at a side of the surface of the drift layer;

forming a channel layer of the first conductivity type on a surface of the trench, the channel layer being made of silicon carbide;

forming an gate insulation film on a surface of the channel layer within the trench;

forming a gate electrode on the gate insulation film within the trench;

forming a pair of source regions of the first conductivity type on surface portions of the base regions, the source regions being made of silicon carbide, and more highly doped than the drift layer;

forming a first electrode electrically connected to the source regions; and forming a second electrode on a back surface of the substrate.

According to the present invention, it is possible to prevent the gate insulation film of a trench-gate type SiC semiconductor device from being broken.

Other advantages and features of the invention will become apparent from the following description including the drawings and claims.

PREFERRED EMBODIMENTS OF THE INVENTION

Figure 1:
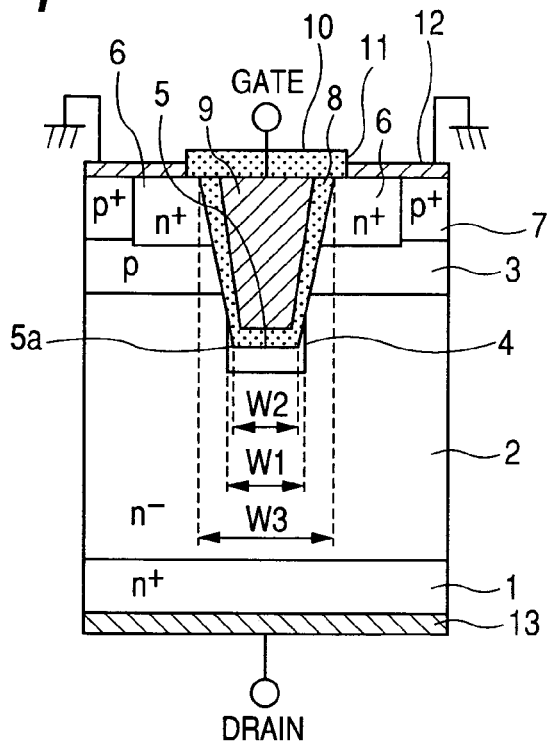
FIG. 1 is a cross-sectional view of an inverted MOSFET according to a first embodiment of the invention.

Embodiments of the present invention are described below with reference to the drawings. In the below-described embodiments, the same or corresponding components are represented by the same reference numerals or characters.

First Embodiment

FIG. 1 is a diagram showing a cross-section of a trench-gate type inverted MOSFET (referred to simply as a MOSFET hereinafter) as a SiC semiconductor device including a vertical power device according to a first embodiment of the invention.

As shown in FIG. 1, a planar type MOSFET and its circumferential portion are formed on a major surface of an n+-type substrate 1 having a thickness of about 300 μm. The n+-type substrate 1 has an impurity concentration of about $1 \times 10^{19}$ cm$^{-3}$. As n-type impurities of the substrate 1, phosphorus may be used.

On the major surface of the substrate 1, there is formed an n-type semiconductor layer 2 by epitaxial growth. The n-type semiconductor layer 2 is formed to have an impurity concentration of about $1 \times 10^{16}$ cm$^{-3}$, and a thickness of 10 μm. As n-type impurities of the n-type semiconductor layer 2, phosphorus may be used.

In the surface portion of the n-type semiconductor layer 2, a plurality of p-type base regions 3 are formed at predetermined spacing distances. The p-type base regions 3 are formed by ion injection so as to have an impurity concentration of from $1 \times 10^{17}$ to $-2 \times 10^{19}$ cm$^{-3}$, preferably, $1 \times 10^{17}$ cm$^{-3}$, and a thickness (depth) of from 0.4 to 1.0 μm, preferably, 0.7 μm.

In the n-type semiconductor layer 2, a deep p-type layer 4 is provided at a location some distance from the p-type base regions 3. This deep p-type layer 4 is formed so as to surround the bottom portion of a later-described trench 5, including the corner portions of this bottom portion. The deep p-type deep 4 has an impurity concentration of from $5 \times 10^{16}$ to $2 \times 10^{19}$ cm$^{-3}$, preferably, $1 \times 10^{17}$ cm$^{-3}$, a width W1 in the direction of the substrate surface of from 0.35 to 0.4 μm, preferably, 0.35 μm, and a depth of from 0.8 to 3.0 μm, preferably, 1.4 μm.

In the surface portions of the p-type base regions 3, n+-type source regions 6 are formed so as to be spaced apart across the trench 5. The n+-type source regions 6 have a high impurity concentration of over $3 \times 10^{20}$ cm$^{-3}$, for example, $1.0 \times 10^{21}$ cm$^{-3}$, and a depth of 0.3-0.4 μm, for example, 0.3 μm.

In the surface portions of the p-type base regions 3, also p-type body layers 7 are formed. The p-type body layers 7 have a surface concentration of about $1 \times 10^{21}$ cm$^{-3}$, and a thickness of about 0.3 μm.

The trench 5 is formed so as to penetrate through the n+-type source regions 6 and the p-type base regions 3, and reach the n-type semiconductor layer 2 beneath the p-type base region 3. Accordingly, the MOSFET has a structure in which the n+-type source regions 6 and the p-type base regions are in contact with the sides of the trench 5. The sidewall of this trench 5 is tapered so that the width W2 of its bottom surface is smaller than the width W3 of its entrance portion. More specifically, the width W2 of the bottom surface is set between 0.35 and 0.45 μm, and the width W3 of the entrance portion is set to such a value that the taper angle at the bottom surface of the trench 5 is between 100 and 130 degrees. The deep p-type layer 4 is formed so as to surround the entire bottom surface of the trench 5 and both the corner portions 5a. Accordingly, the deep p-type layer 4 has a structure in which it projects outside the trench 5 beyond both the corner portions 5a by about the same distance in the directions parallel to the substrate surface.

On the inner wall of the trench 5, there is formed a gate oxidation film having a thickness of 52 nm, for example. A portion of each p-type base region 3, which adjoins the gate oxidation film 8, that is, a portion of each p-type base region 3, which is located at the sidewall of the trench 5 serves as a channel region.

On the surface of the gate oxidation film 8, there is located a gate electrode 9 made of polysilicon doped with n-type impurities (phosphorus, for example). This gate electrode 9 fills in the trench 5.

An inter-layer insulation film 10 is formed so as to cover the gate electrode 9 and an exposed part of the surface of the gate oxidation film 8. In the inter-layer insulation film 10 and the gate oxidation film 8, there are formed a contact hole 11 leading to the n+-type source regions 6 and the p-type body layers 7, and a contact hole (not shown) leading to the gate electrode 9. Inside the contact hole 11, there are located the n+-type source region 6, the p-type body layer 7, a source electrode 12 made of Ti/Al.

On the back surface side of the substrate 1, there is formed a drain electrode 13 made of Ni, for example, and serving as a back surface electrode.

In the MOSFET having the above described structure, a channel region is set as a current path at a portion of each p-type base region 3 adjoining the gate oxidation film 8, during its normal operation in which the drain electrode 13 is applied with 2V, the gate electrode 9 is applied with 15 V, and the source electrode 12 is applied with 0 V, for example. A current is passed between the n⁺-type source regions 6, and the n-type semiconductor layer 2 serving as a drain and accordingly the substrate 1, through this current path. This current can be controlled by controlling the voltage applied to the gate electrode 9 to thereby control the width of the channel region.

As described above, in this embodiment, the p-type deep layer 4 formed surrounding the bottom surface and both the corner portion 5a of the trench 5 is located at some distance from the p-type base regions 3. Accordingly, since the end of the channel region definitely contacts the n-type semiconductor layer 2 in the vicinity of the bottom surface of the trench 5, it does not occur that the current is prevented from flowing. The on-resistance of the MOSFET of this embodiment was measured to be $3.0\Omega \cdot cm^2$. Accordingly, it can be said that the MOSFET of this embodiment has the same order of the on-resistance as that of conventional trench gate MOSFETs.

Figure 2:
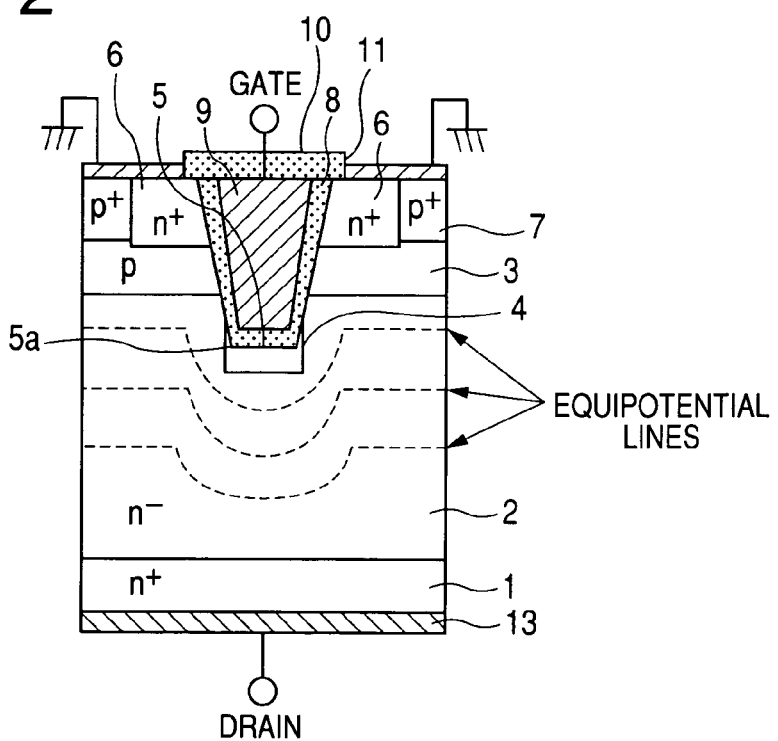
FIG. 2 is the cross-sectional view of the inverted MOSFET with equipotential lines added in case the drain electrode is applied with a high voltage, and the voltages of the gate and source electrodes are 0 V, when the MOSFET is in the off-state.

Since the p-type deep layer 4 is formed surrounding the bottom surface and both the corner portions 5a of the trench 5, the MOSFET of this embodiment operates in the following way when it is in the off-state. FIG. 2 is a diagram showing equipotential lines in the MOSFET when it is in the off-state in a condition where the drain electrode 13 is applied with a high voltage (1200 V, for example), and the gate electrode 9 and the source electrode 12 are at the potential of 0 V.

In this condition, no inversion layer is formed at the sidewall of the trench 5, and accordingly, no channel region is set, because no voltage application is made to the gate electrode 9. As a consequence, since the electrons injected to the n⁺-type regions 6 cannot enter the p-type base regions 3, no current flows. In this state, a depletion layer extends from between the p-type base regions 3 and the n-type semiconductor layer 2. At this time, since the impurity concentration of the p-type base regions 3 is higher than that of the n-type semiconductor layer 2, the depletion layer extends mainly towards the side of the n-type semiconductor layer 2. The depletion layer also extends beneath the trench 5.

In the conventional structure in which the p-type deep layer 4 is not provided, since the electric field concentrates on the corner portions of the trench, and the strength of the electric field there becomes 4 MV/cm or so, destruction tends to occur.

On the other hand, in this embodiment, since the p-type deep layer 4 is provided, and both the corner portions 5a of the trench 5 are located within the p-type deep layer 4, the electric field does not concentrate on the corner portions 5a as seen from FIG. 2, and the strength of the electric field there can be suppressed within 1 MV/cm. Accordingly, even when the drain is applied with a voltage as high as 1200 V, the gate oxidation film 8 can be prevented from being destroyed at the corners 5a of the trench 5. Hence, according to this embodiment, the drain withstand voltage, which is about 600 V in the conventional MOSFETs, can be increased up to 1200 V.

Next, a method of manufacturing the MOSFET of this embodiment will be explained with reference to the drawings showing manufacturing processes.

Figure 3A:
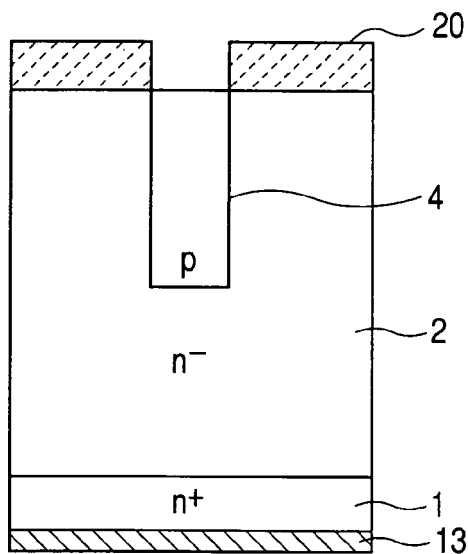
FIGS. 3A to 3D are diagrams for explaining a method of manufacturing the MOSFET shown in FIG. 1.

Manufacturing Process Shown in FIG. 3A

After the n⁺-type substrate 1 is prepared, the n-type semiconductor layer 2 is epitaxially grown on the major surface of the substrate 1 to have an impurity concentration of about $1\times10^{16}$ cm⁻³, and a thickness of 10 μm. Subsequently, after a mask 20 made of LTO, for example, is located, this mask 20 is opened in a prospective region for forming the p-type deep layer 4 through a photolithography process. Thereafter, ion injection and activation of p-type impurities (aluminum, for example) are performed to form the p-type deep layer 4.

Figure 3B:
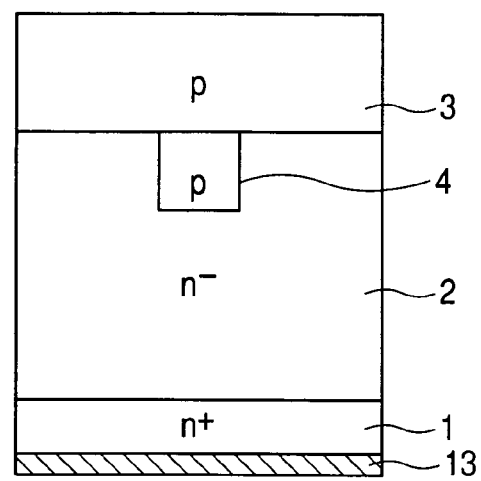

Manufacturing Process Shown in FIG. 3B

After the mask 20 is removed, a mask (not shown) made of LTO, for example, is formed on the surface of the n-type semiconductor layer 2. Subsequently, the mask is opened in a prospective region for forming the p-type base region 3 through a photolithography process. Thereafter, ion injection and activation of p-type impurities (aluminum, for example) are performed to form the p-type base region 3.

Figure 3C:
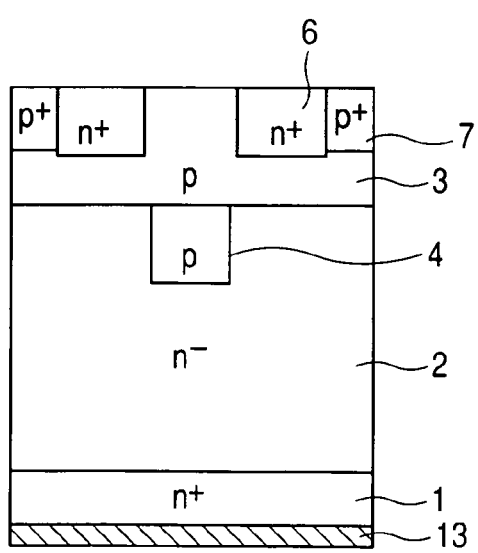

Manufacturing Process Shown in FIG. 3C

After removal of the mask, a mask (not shown) made of LTO, for example, is formed on the p-type base region 3. Subsequently, the mask is opened at prospective regions for forming the n⁺-type source regions 6 through a photolithography process. Thereafter, n-type impurities (phosphorus, for example) are injected. Next, after removal of the mask, a mask made of LTO, for example, is formed again. Subsequently, the mask is opened at prospective regions for forming the p-type body layers 7 through a photolithography process. Thereafter, p-type impurities (aluminum, for example) are injected from above the mask, and then activated, in order to activate the injected p-type and n-type impurities. By this, the n⁺-type source regions 6 and the p-type body layers 7 are formed. Thereafter the mask is removed.

Figure 3D:
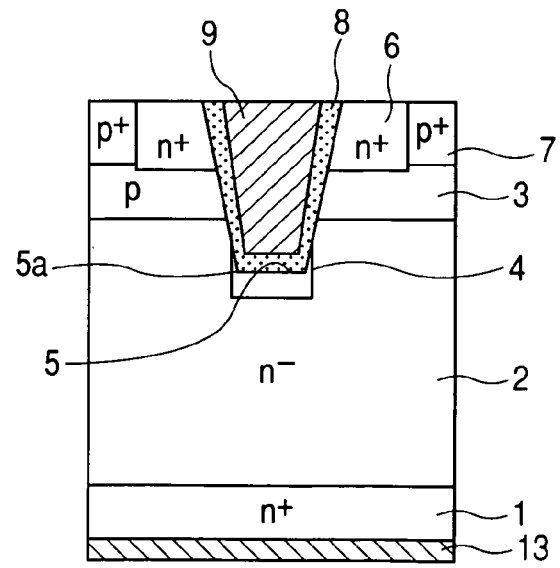

Manufacturing Process Shown in FIG. 3D

An etching mask (not shown) is formed on the n⁺-type source regions 6 and the p-type body layers 7. Subsequently, this etching mask is opened in a prospective region for forming the trench 5. Next, anisotropic etching is performed by use of the etching mask, and then isotropic etching is performed in order that the sidewall of the trench 5 has the tapered shape in which the entrance portion side width W1 is large and the bottom surface side width W2 is small.

Thereafter, after removal of the etching mask, a gate oxidation film forming process is performed to form the gate oxidation film 8. More specifically, by performing gate oxidation using a pyrogenic method in a wet environment, the gate oxidation film 8 is formed. Next, on the surface of the gate oxidation film 8, a polysilicon layer doped with n-type impurities is formed at a temperature of 600 degrees C. to have a thickness of 440 μm. Subsequently, the polysilicon layer and the gate oxidation film 8 are patterned using a resist as a mask, which is formed by photolithography etching. This makes it possible for the gate insulation film 8 and the gate electrode 9 to remain in the trench 5.

Thereafter, although not shown in the drawing, after the inter-layer insulation film 10 is formed, the contact hole 11 leading to the n⁺-type source region 6 and the p-type body layer 7, and the contact hole (not shown) leading to the gate electrode 9 are formed. Thereafter, an electrode material film is formed so as to fill in the contact hole 11. Subsequently, this electrode material film is patterned to form the source electrode 12 and a not shown gate wire. By forming the drain electrode 13 made of Ni, for example, on the back surface of the substrate 1, the MOSFET shown in FIG. 1 is completed.

Second Embodiment

Next, a second embodiment of the present invention is described. The second embodiment differs from the first embodiment in that the MOSFET of the second embodiment is not an inverted MOSFET but an accumulation-mode MOSFET. The following description on the second embodiment focuses on this difference.

Figure 4:
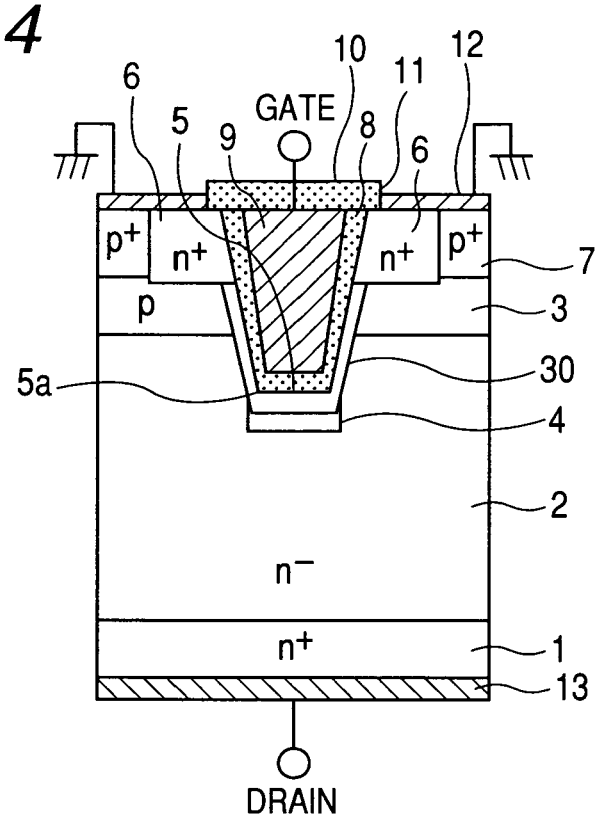
FIG. 4 is a cross-sectional view of an accumulation-mode MOSFET according to a second embodiment of the invention.

FIG. 4 is a cross-sectional view of an accumulation-mode MOSFET according to the second embodiment. As shown in FIG. 4, in this embodiment, an n-type channel layer 30 is located so as to be the inner wall of the trench 5. The n-type channel layer 30 is formed so as to connect between the n-type semiconductor layer 2 and the n⁺-type source regions 6. In this embodiment, the n-type channel layer 30 extends to the bottom surface of the trench 5 to be in contact with the p-type deep layer 4, so that a portion of the inner wall of the trench 5, which is located throughout beneath the n⁺-type source regions 6 is constituted by the n-type channel layer 30. The p-type deep layer 4 has an impurity concentration of about $1\times10^{16}$ cm$^{-3}$, and a thickness of about 0.3 μm.

The operation of the accumulation-mode MOSFET having the above described structure will be explained with particular emphasis on the difference with the first embodiment.

SiC posses an inherent potential of about 3 V when it has a high impurity concentration, for example, of $1.0\times10^{19}$ cm$^{-3}$. Accordingly, even when the voltage of the source electrode 12 is 0 V, each p-type base region behaves as if it is being applied with −3 V. Accordingly, a depletion layer extends from each p-type base region, and the neighborhood of each p-type base region 3 behaves as if it is an insulator. In this case, even if a positive voltage is applied to the drain electrode 13, no current flows, because the n-type channel layer 30 behaves as if it is an insulator, and accordingly, electrons cannot pass through the n-type channel layer 30.

On the other hand, during the on period of the MOSFET when the voltage of the drain electrode 13 is 2 V, the voltage of the gate electrode 9 is 15 V, and the voltage of the source electrode 12 is 0 V, a channel region (accumulation layer) is set as a current path in the n-type channel layer 30, and a current is passed between the n⁺-type source regions 6 and the n-type semiconductor layer 2 and accordingly the substrate 1 through this current path. This current can be controlled by controlling the voltage applied to the gate electrode 9 to thereby control the width of the depletion layer formed in the channel region. At this time, since the channel width in the case of using the accumulation channel can be made greater than in the case of using the inversion channel, it is possible to reduce the on-resistance of the MOSFET. A measurement shows that the on-resistance of the MOSFET of the second embodiment is 2.8Ω·cm² which is smaller than that of the first embodiment by 0.2Ω·cm².

Figure 5:
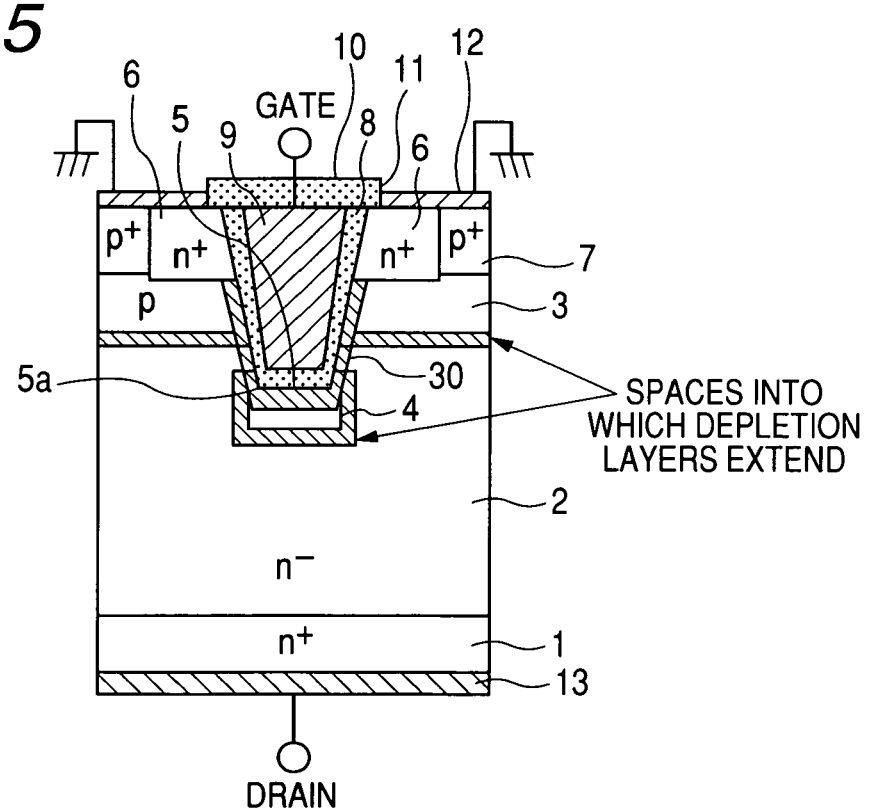
FIG. 5 is a diagram showing how a depletion layer extends in the MOSFET shown in FIG. 4 in case the drain electrode is applied with a high voltage, and the voltage of the gate and source electrodes are 0 V when the MOSFET is in the off-state.

During the off period of the MOSFET, if a high voltage (1200 V, for example) is applied to the drain electrode 13 when the gate electrode 9 and the source electrode 12 are both at the potential of 0V, a depletion layer extends from between each p-type base region 3 and the n-type semiconductor layer 2. FIG. 5 is a diagram showing how the depletion layers extend. At this time, since the impurity concentration of the p-type base regions 3 is much higher than that of the n-type semiconductor layer 2, the depletion layers extend virtually only towards the side of the n-type semiconductor layer 2. The extension of the depletion layers at this time is greater than that when the voltage of the drain electrode 13 is 0 V, and accordingly, the region behaving as an insulator further extends, no current is allowed to flow. Also in this embodiment, since the p-type deep layer 4 is formed so as to surround the bottom surface and both the corner portions 5a of the trench 5, it is possible to suppress the electric field concentration at the corner portions 5a of the trench 5, to thereby prevent the gate oxidation film 8 from being broken. Hence, according to the second embodiment, the drain withstand voltage, which is about 600 V in the conventional MOSFETs, can be increased up to 1200 V.

Next, a method of manufacturing the MOSFET of the second embodiment will be explained with reference to the drawings showing manufacturing processes.

Figure 6A:
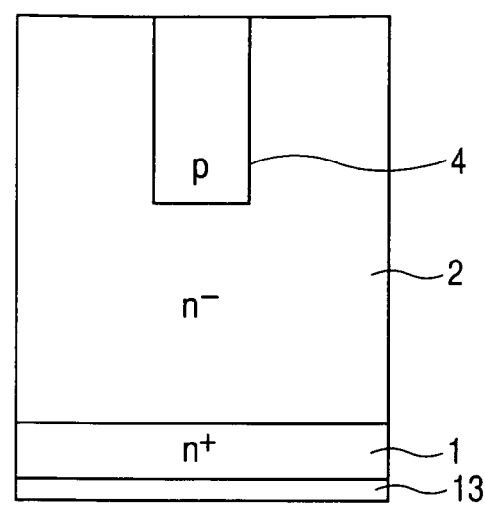
FIGS. 6A to 6C are diagrams for explaining a method of manufacturing the MOSFET shown in FIG. 4.
Figure 6B:
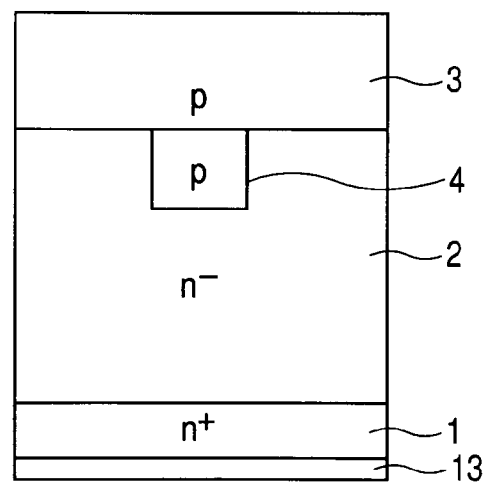

First, the p-type deep layer 4 and the p-type base regions 3 are formed by the processes shown in FIG. 6A and FIG. 6B which are similar to the processes shown in FIG. 3A and FIG. 3B. Thereafter, the processes shown in FIG. 6C and after are performed.

Figure 6C:
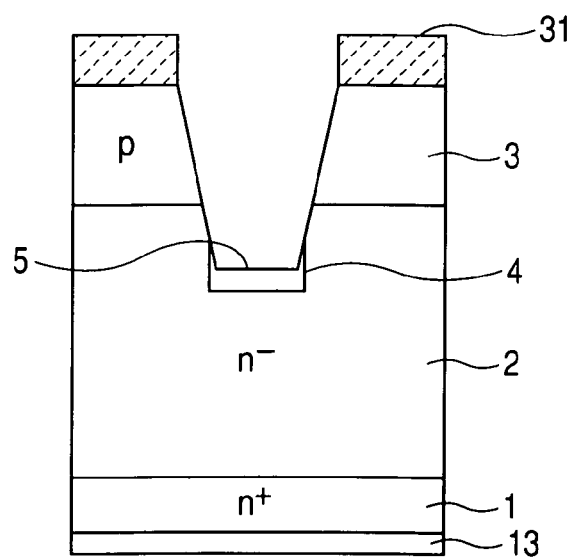

Manufacturing Process Shown in FIG. 6C

An etching mask 31 is formed on the n-type semiconductor layer 2 and the p-type base regions 3. Subsequently, this etching mask 31 is opened in a prospective region for forming the trench 5. Next, anisotropic etching is performed by use of the etching mask 31, and then isotropic etching is performed in order that the sidewall of the trench 5 has the tapered shape in which the entrance portion side width W1 is large and the bottom surface side width W2 is small.

Figure 7A:
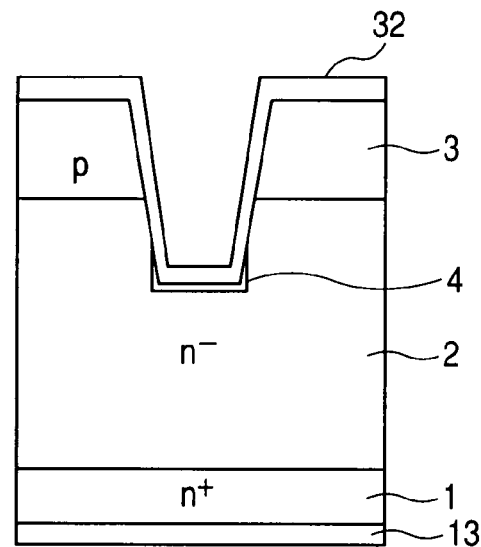
FIGS. 7A to 7C are diagrams for explaining the method of manufacturing the MOSFET shown in FIG. 4.

Manufacturing Process Shown in FIG. 7A

After removal of the etching mask 31, the n-type layer 32 is formed on throughout the substrate surface including the inner wall of the trench 5 by epitaxial growth, such that the n-type layer 32 has an impurity concentration of about $1\times10^{16}$ cm$^{-3}$, and a thickness of about 0.3 μm.

Figure 7B:
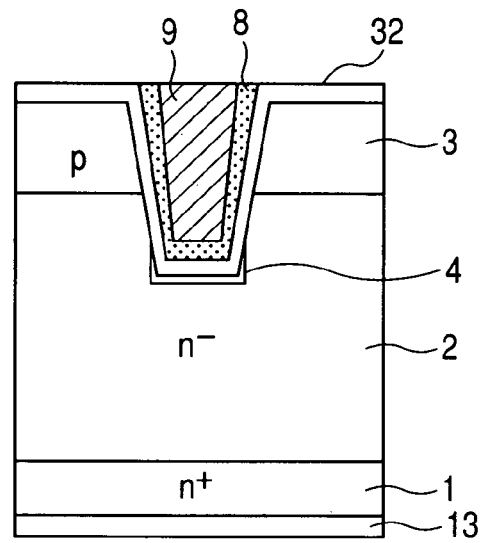

Manufacturing Process Shown in FIG. 7B

The gate oxidation film 8 is formed in this process. More specifically, by performing gate oxidation using a pyrogenic method in a wet atmosphere, the gate oxidation film 8 is formed. Next, on the surface of the gate oxidation film 8, a polysilicon layer doped with n-type impurities is formed at a temperature of 600 degrees C. to have a thickness of about 440 μm. Subsequently, the polysilicon layer and the gate oxidation film 8 are patterned using a resist as a mask, which is formed by photolithography etching. This makes it possible for the gate insulation film 8 and the gate electrode 9 to remain in the trench 5.

Figure 7C:
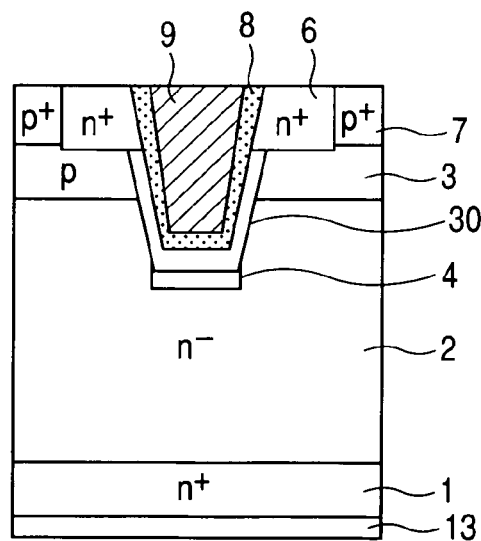

Manufacturing Process Shown in FIG. 7C

After removal of the mask, a mask made of LTO, for example, is formed on the n-type layer 32 and the gate electrode 9. Subsequently, the mask is opened at prospective regions for forming the n⁺-type source regions 6 through a photolithography process. Thereafter, n-type impurities (phosphorus, for example) are injected. Next, after removal of the mask, a mask made of LTO, for example, is formed again. Subsequently, this mask is opened at prospective regions for forming the p-type body layers 7 through a photolithography process. Thereafter, p-type impurities (aluminum, for example) are injected from above the mask, and then activated, in order to activate the injected p-type and n-type impurities. By this, the n⁺-type source regions 6 and the p-type body layers 7 are formed. Thereafter the mask is removed.

The processes thereafter are the same as those in the first embodiment. After performing these processes, the accumulation-mode MOSFET of the second embodiment is completed.

Third Embodiment

Next, a third embodiment of the present invention is described. The third embodiment differs from the second embodiment in the depth of the p-type base regions 3. The following description on the third embodiment focuses on this difference.

Figure 8:
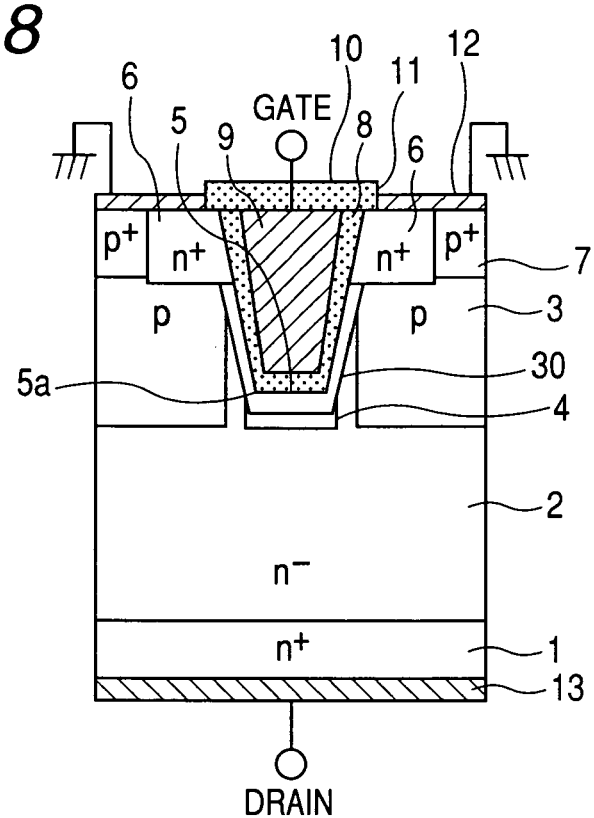
FIG. 8 is a cross-sectional view of an accumulation-mode MOSFET according to a third embodiment of the invention.
Figure 9:
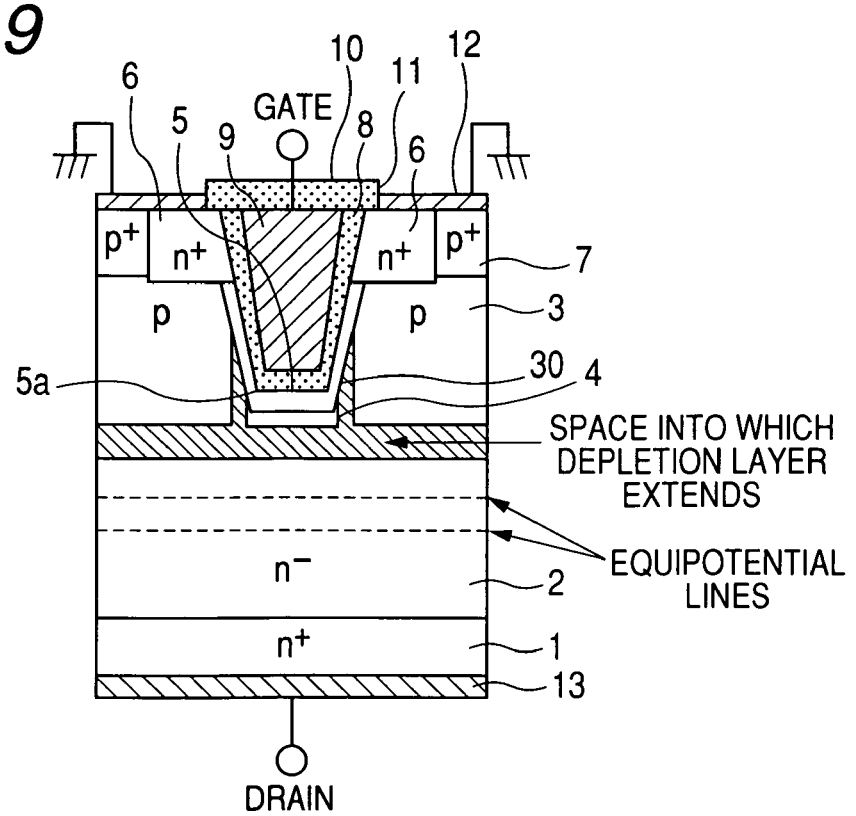
FIG. 9 is a diagram showing how a depletion layer extends, and showing equipotential lines in the MOSFET shown in FIG. 8 when it is in the off-state.

FIG. 8 is a cross-sectional view of an accumulation-mode MOSFET according to the third embodiment. FIG. 9 is a diagram showing how a depletion layer extends, and showing equipotential lines in this MOSFET. As shown in FIG. 8, the p-type base regions 3 have the same depth with the p-type deep layer 4.

The MOSFET of the third embodiment operates in about the same way with the MOSFET of the second embodiment. However, the equipotential lines in this embodiment are parallel to the substrate surface. Accordingly, in this embodiment, a depletion layer extends beneath the p-type base regions 3 and the p-type deep layer 4 in the direction parallel to the substrate surface. This makes it possible to suppress the electric field concentration at the corner portions of the trench 5, to thereby prevent the gate oxidation film 8 from being broken. According to the third embodiment, it is possible to increase the drain withstand voltage up to 1330 V, which is higher than that obtainable by the first or second embodiment.

Next, a method of manufacturing the MOSFET of the third embodiment will be explained with reference to the drawings showing manufacturing processes.

Figure 10A:
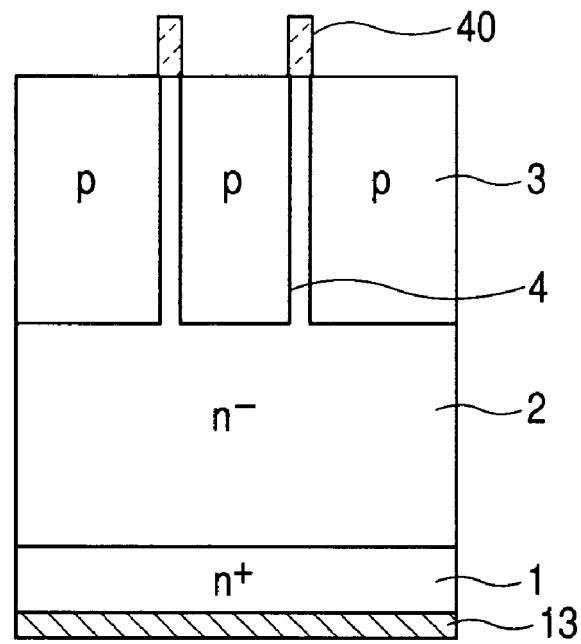
FIGS. 10A and 10B are diagrams for explaining a method of manufacturing the MOSFET shown in FIG. 8.
Figure 10B:
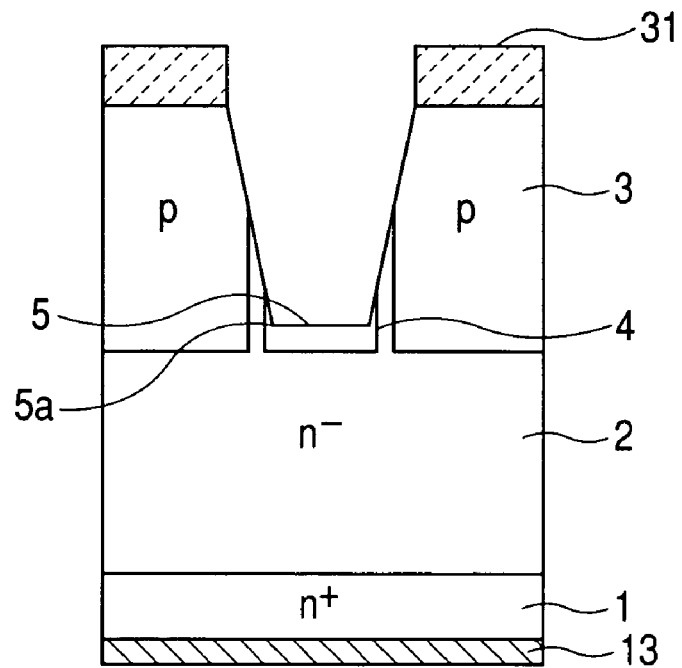
Figure 11A:
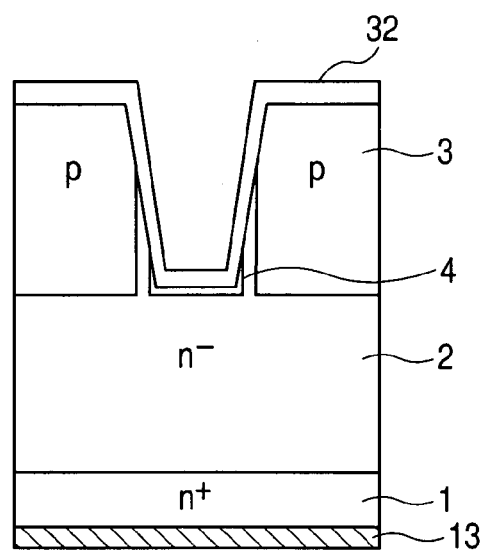
FIGS. 11A to 11C are diagrams for explaining the method of manufacturing the MOSFET shown in FIG. 8.
Figure 11B:
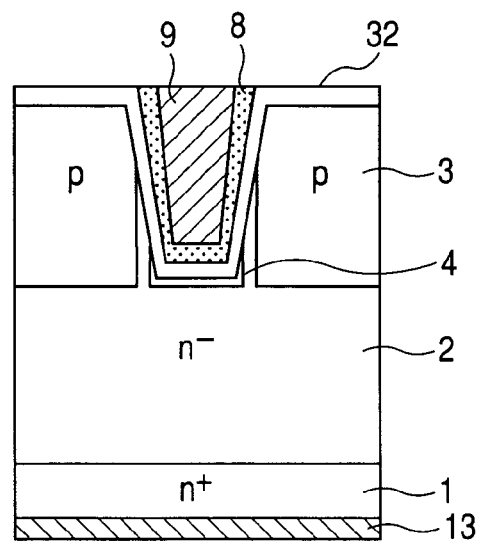
Figure 11C:
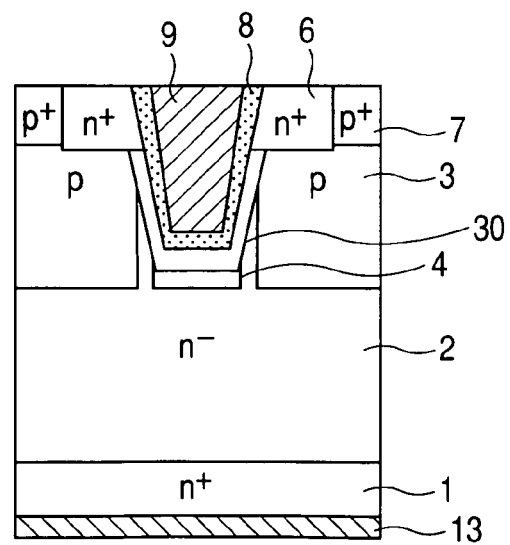

First, the p-type deep layer 4 and the p-type base regions 3 are formed by the processes shown in FIG. 10A and FIG. 10B which are similar to the processes shown in FIG. 3A and FIG. 3B. The p-type deep layer 4 and the p-type base regions 3 may be formed in succession by use of different masks as in the case of the second embodiment. Alternatively, they may be formed at a time by use of the same mask 40 which is opened at prospective regions for forming the p-type deep layer 4 and the p-type base regions 3 as shown in FIG. 10A. This makes it possible to simplify the manufacturing processes. In addition, this makes it possible for the manufactured MOSFETs to have uniform characteristics, because the p-type deep layer 4 and the p-type base regions 3 definitely have the same depth to remove variation in the withstand voltage, and the distance between the p-type deep layer 4 and the p-type base regions 3 can be set in a self-aligned manner.

After that, the processes shown in FIG. 10B, and FIGS. 11A-11C, which are similar to the processes shown in FIG. 6C, and FIGS. 7A-7C explained in the second embodiment, are performed. The processes after that are basically the same as the first embodiment. After performing these processes, the accumulation-mode MOSFET of the third embodiment is completed.

Although the third embodiment has been described with respect to the accumulation-mode MOSFET, it is possible that the p-type deep layer 4 and the p-type base regions 3 are formed to have the same depth in the inverted MOSFET as described in the first embodiment. In this case, the same advantages as described above can be obtained.

Fourth Embodiment

Next, a fourth embodiment of the present invention is described. The fourth embodiment differs from the third embodiment in the width W1 of the p-type deep layer 4, and the shape of the trench 5. The following description on the fourth embodiment focuses on these differences.

Figure 12:
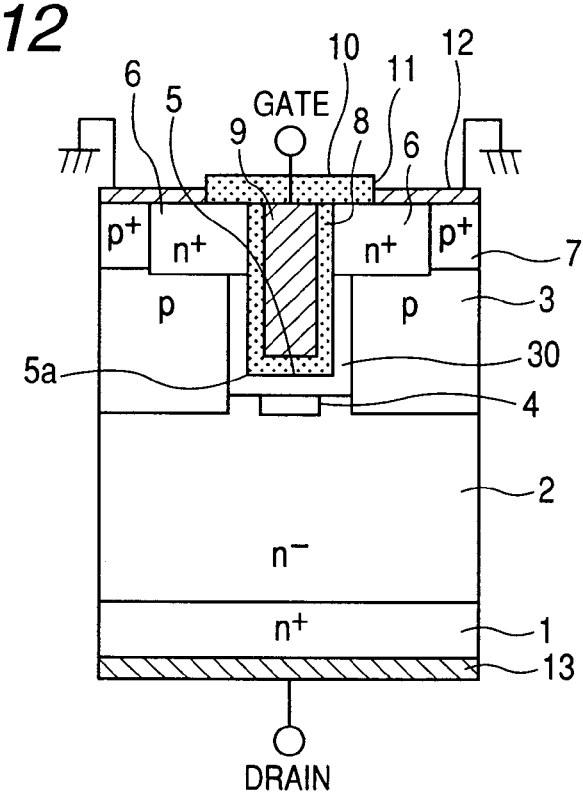
FIG. 12 is a cross-sectional view of an accumulation-mode MOSFET according to a fourth embodiment of the invention.
Figure 13:
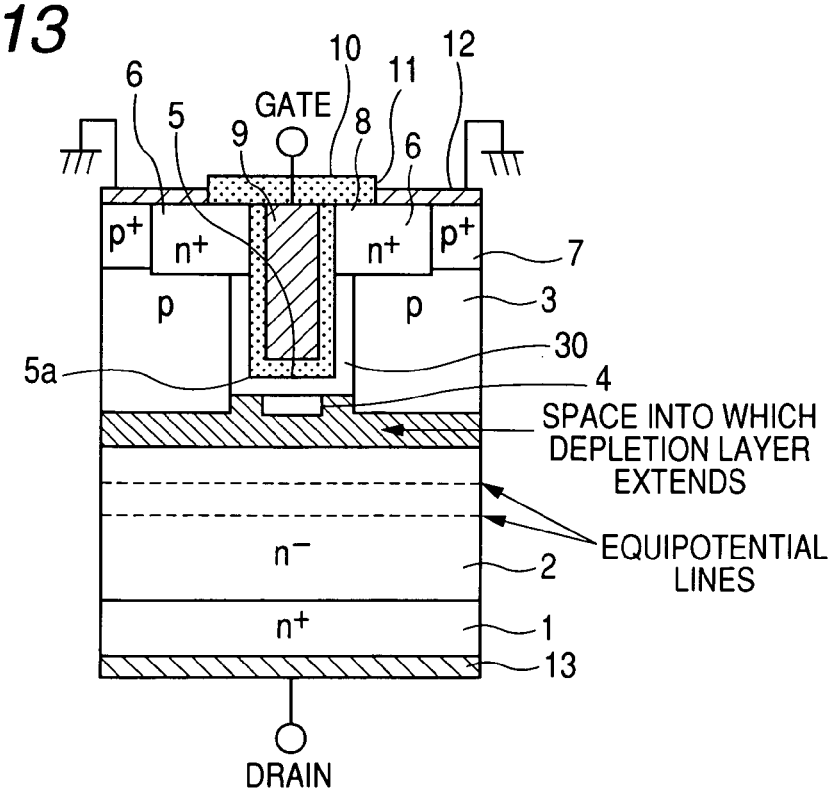
FIG. 13 is a diagram showing how a depletion layer extends, and showing equipotential lines in the MOSFET shown in FIG. 12 when it is in the off-state.

FIG. 12 is a cross-sectional view of an accumulation-mode MOSFET according to the fourth embodiment. FIG. 13 is a diagram showing how a depletion layer extends, and showing equipotential lines in this MOSFET. As shown in FIG. 12, in this embodiment, the p-type base regions 3 and the p-type deep layer 4 have the same depth as in the case of the third embodiment. However, unlike the third embodiment, the width W1 of the p-type deep layer 4 is made smaller than the width W2 of the bottom surface of the trench 5 so that the p-type deep layer 4 is located only inside the corner portions 5a of the trench 5, and the sidewall of the trench 5 is not tapered so that it is vertical with respect to the substrate surface.

The operation of the MOSFET of the fourth embodiment in the on-state is about the same as that of the third embodiment. In the off-state, although the p-type deep layer 4 is made narrow, since the p-type deep layer 4 and the p-type base regions 3 have the same depth, the equipotential lines become parallel to the substrate surface, and a depletion layer extends beneath the p-type base regions 3 and the p-type deep layer 4 in the direction parallel to the substrate surface. Accordingly, since the bottom portion of the trench gate is surrounded by the depletion layer, it becomes possible to prevent occurrence of electric field concentration at the corner portions 5a of the trench 5, to thereby prevent the gate oxidation film 8 from being broken. According to the third embodiment, it is possible to increase the drain withstand voltage up to 1300 V, which is higher than that obtainable by the first or second embodiment.

Furthermore, in this embodiment, since the width W1 of the p-type deep layer 4 is made narrower than the width W2 of the bottom surface of the trench 5, it becomes possible to increase the width of the n-type semiconductor layer 2 connecting with the n-type channel layer 30, to thereby reduce the on-resistance. For example, when the widths W2, W3 of the trench 5 are both 0.5 μm, the on-resistance can be made as small as $3.1\Omega \cdot cm^2$. In this embodiment, the trench 5 is shaped such that the sides thereof are perpendicular to the substrate surface for the purpose of further reducing the on-resistance. However, if the trench 5 has the tapered shape, the on-resistance can be made smaller than that in the third embodiment.

The MOSFET of this embodiment can be manufactured by manufacturing processes which are the same as those for manufacturing the MOSFET of the third embodiment except that a process for making the width W1 of the p-type deep layer 4 narrower than the width W2 of the bottom surface of the trench 5 is added after the process of forming the p-type deep layer 4, and the process of forming the trench 5 is performed only by the anisotropic etching.

Fifth Embodiment

Next, a fifth embodiment of the present invention is described. The fifth embodiment differs from the fourth embodiment in that the p-type deep layer 4 is eliminated, and the structure of the p-type base regions 3 is changed. The following description on the fifth embodiment focuses on these differences.

Figure 14:
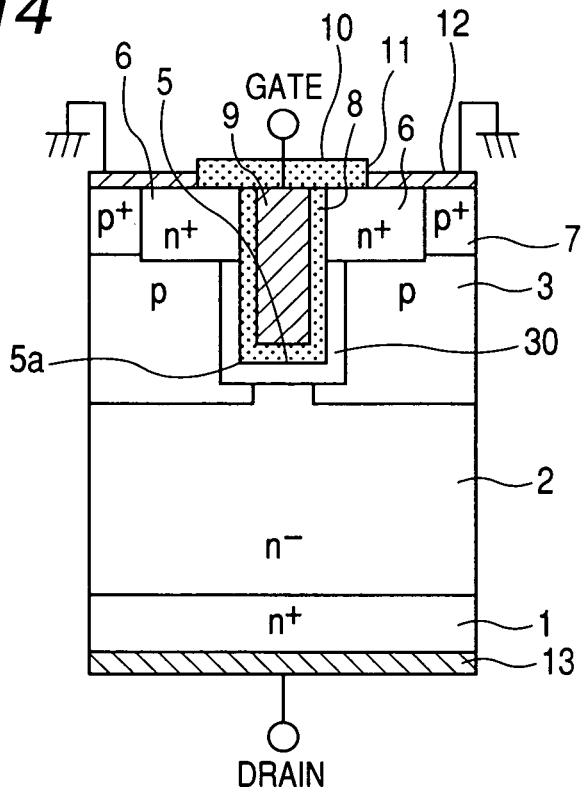
FIG. 14 is a cross-sectional view of an accumulation-mode MOSFET according to a fifth embodiment of the invention.
Figure 15:
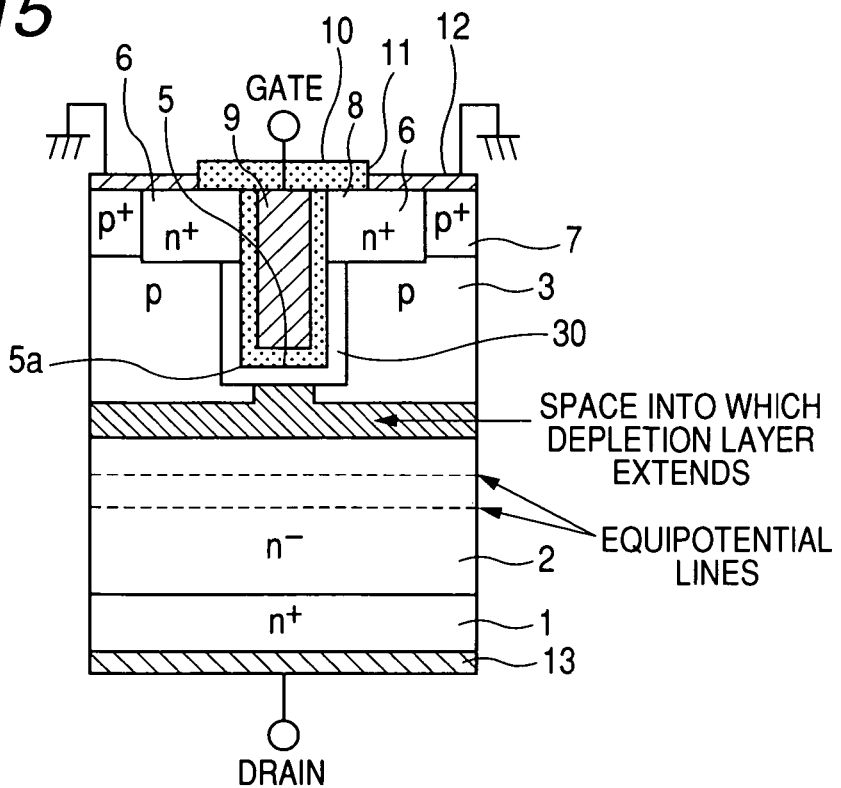
FIG. 15 is a diagram showing how a depletion layer extends, and showing equipotential lines in the MOSFET shown in FIG. 14 when it is in the off-state.

FIG. 14 is a cross-sectional view of an accumulation-mode MOSFET according to the fifth-embodiment. FIG. 15 is a diagram showing how a depletion layer extends, and showing equipotential lines in this MOSFET. As shown in FIG. 14, the MOSFET of this embodiment has a structure that the p-type base regions 3 have a depth extending below the n-type channel layer 30 so that it reaches below portions of the n-type channel layer 30, which are located at the corner portions 5a of the trench 5. The p-type base regions 3 are not located below the center position of the bottom surface of the trench 5. Accordingly, the p-type base regions 3 face across from the trench 5.

The MOSFET of the fifth embodiment operates in about the same way with the MOSFET of the third embodiment. Although the MOSFET of the fifth embodiment is not formed with the p-type deep layer 4, since the p-type base regions 3 reach below the portions of the n-type channel layer 30, which are located at the corner portions 5a of the trench 5, if the drain electrode 13 is applied with a voltage over 600 V in the off-state, a depletion layer extending from each p-type base region 3 towards the n-type semiconductor layer 2 further extends below the n-type channel layer 30. Accordingly, since the bottom portion of the trench gate is surrounded by the depletion layer, it becomes possible to prevent occurrence of electric field concentration at the corner portions 5a of the trench 5, to thereby prevent the gate oxidation film 8 from being broken. According to the fifth embodiment, it is possible to increase the drain withstand voltage up to 1300 V, which is the same as that obtainable by the fourth embodiment.

In the MOSFET of the fifth embodiment, a current flows through a clearance between the p-type base regions 3 facing across the trench 5. Since the clearance can be made wide, the on-resistance can be made as small as 2.8Ω·cm².

The MOSFET of this embodiment can be manufactured by manufacturing processes which are the same as those for manufacturing the MOSFET of the fourth embodiment except that the process of forming the p-type deep layer 4 is eliminated, and the distance between the p-type base regions 3 is made narrower.

Sixth Embodiment

Next, a sixth embodiment of the present invention is described. The sixth embodiment differs from the fifth embodiment in the structure of the p-type base regions 3. The following description on the sixth embodiment focuses on this difference.

Figure 16:
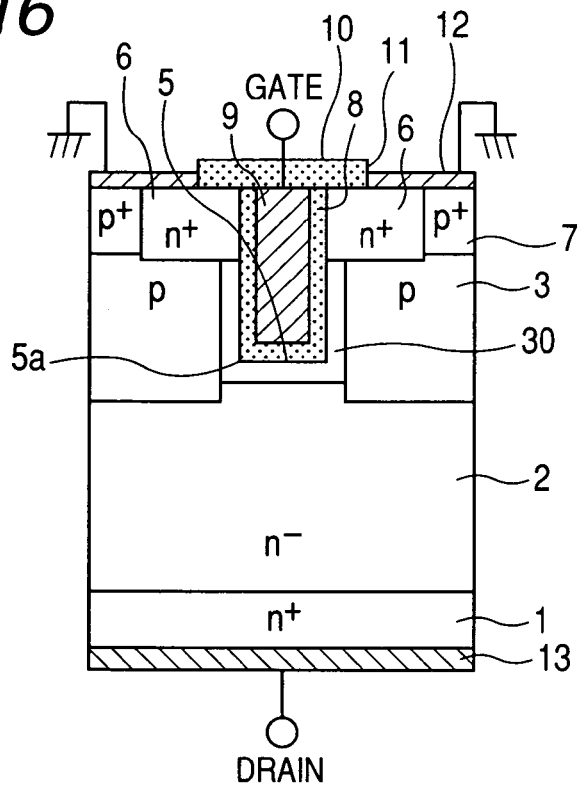
FIG. 16 is a cross-sectional view of an accumulation-mode MOSFET according to a sixth embodiment of the invention.
Figure 17:
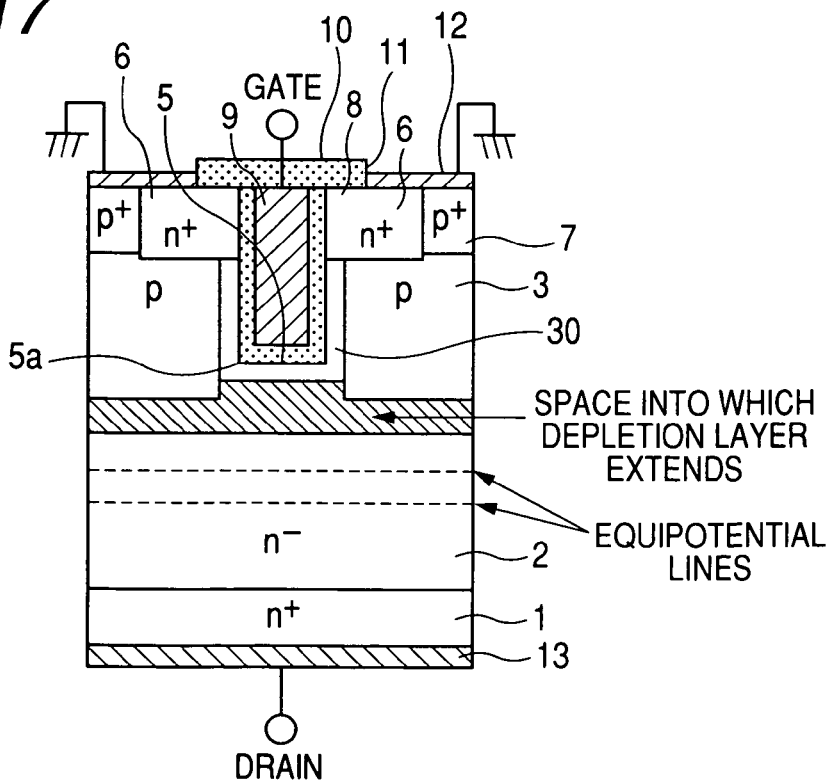
FIG. 17 is a diagram showing how a depletion layer extends, and showing equipotential lines in the MOSFET shown in FIG. 16 when it is in the off-state.

FIG. 16 is a cross-sectional view of an accumulation-mode MOSFET according to the sixth embodiment. FIG. 17 is a diagram showing how a depletion layer extends, and showing equipotential lines in this MOSFET. As shown in FIG. 16, the MOSFET of this embodiment has a structure that the p-type base regions 3 are deeper than the n-type channel layer 30, but do not extend to below portions of the n-type channel layer 30, which are located at the corner portions 5a of the trench 5.

In this structure, although the thickness of the depletion layer may become small at the bottom portion of the trench 5, the depletion layer extending from each p-type base region 3 towards the n-type semiconductor layer 2 further extends below the n-type channel layer 30, and surrounds the bottom portion of the trench 5. Accordingly, like the fifth embodiment, this embodiment makes it possible to prevent occurrence of electric field concentration at the corner portions 5a of the trench 5, to thereby prevent the gate oxidation film 8 from being broken. According to the sixth embodiment, it is possible to increase the drain withstand voltage over 1000 V, which is about the same as that obtainable by the fourth embodiment.

The clearance between the p-type base regions 3 through which a current flows in this embodiment is wider than that of the fifth embodiment. Accordingly, the on-resistance can be reduced to 2.7Ω·cm².

The MOSFET of this embodiment can be manufactured by manufacturing processes which are the same as those for manufacturing the MOSFET of the fifth embodiment except that the clearance between the p-type base regions 3 is made wider.

Seventh Embodiment

Next, a seventh embodiment of the present invention is described. The seventh embodiment differs from the third embodiment in the distance between the p-type base regions 3 and the p-type deep layer 4. The following description on the seventh embodiment focuses on this difference.

Figure 18:
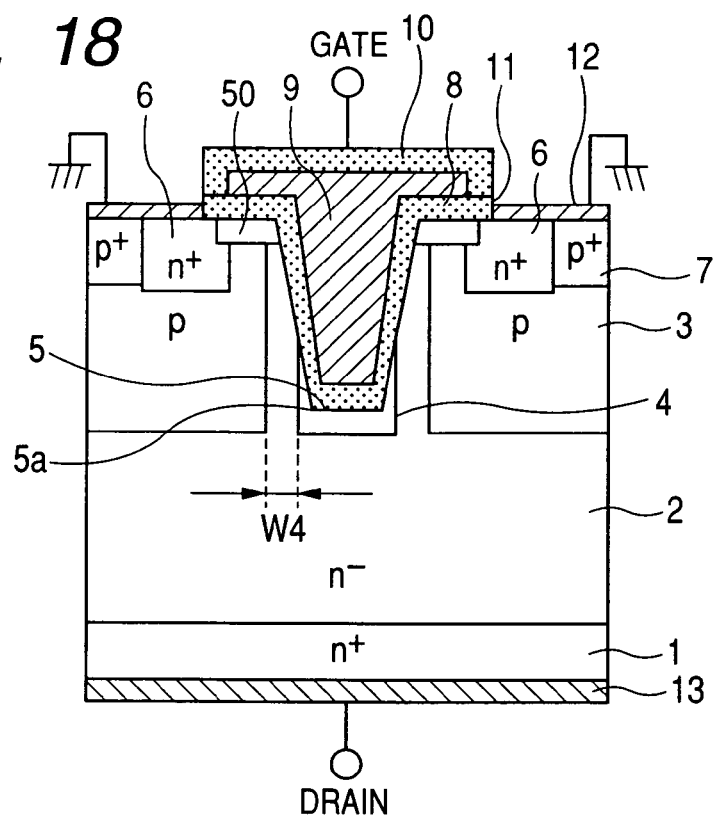
FIG. 18 is a cross-sectional view of an accumulation-mode MOSFET according to a seventh embodiment of the invention.

FIG. 18 is a cross-sectional view of an accumulation-mode MOSFET according to the seventh embodiment. As shown in FIG. 18, in this embodiment, the distance W4 between the p-type base regions 3 and the p-type deep layer 4 is increased to between 0.7 and 2.5 µm.

Such an increase of the distance W4 may cause a state that a current always flows from the n⁺-type source regions 6 to the surface of the trench gate 5, because the depletion layer extending from each p-type base region 3 does not reach the trench 5 when the gate electrode 9 is not applied with a certain voltage. Accordingly, in this embodiment, an n⁻-type surface channel layer 50 is provided above a portion of each p-type base region 3, which is located between the n⁺-type source region and the trench 5, and the gate oxidation film 8 is formed so as to be located also on the surface of the surface channel layer 50, so that the gate electrode 9 is extended over the surface channel layer 50 with the gate oxidation film 8 being interposed therebetween. The surface channel layer 50 has a thickness of from 0.5 to 2.0 µm, preferably, 0.5 µm, and an impurity concentration of from 1×10¹⁵ to 1×10¹⁷ cm⁻³, preferably, 1×10¹⁶ cm⁻³. The accumulation-mode MOSFET of this embodiment has the above described structure.

Figure 19:
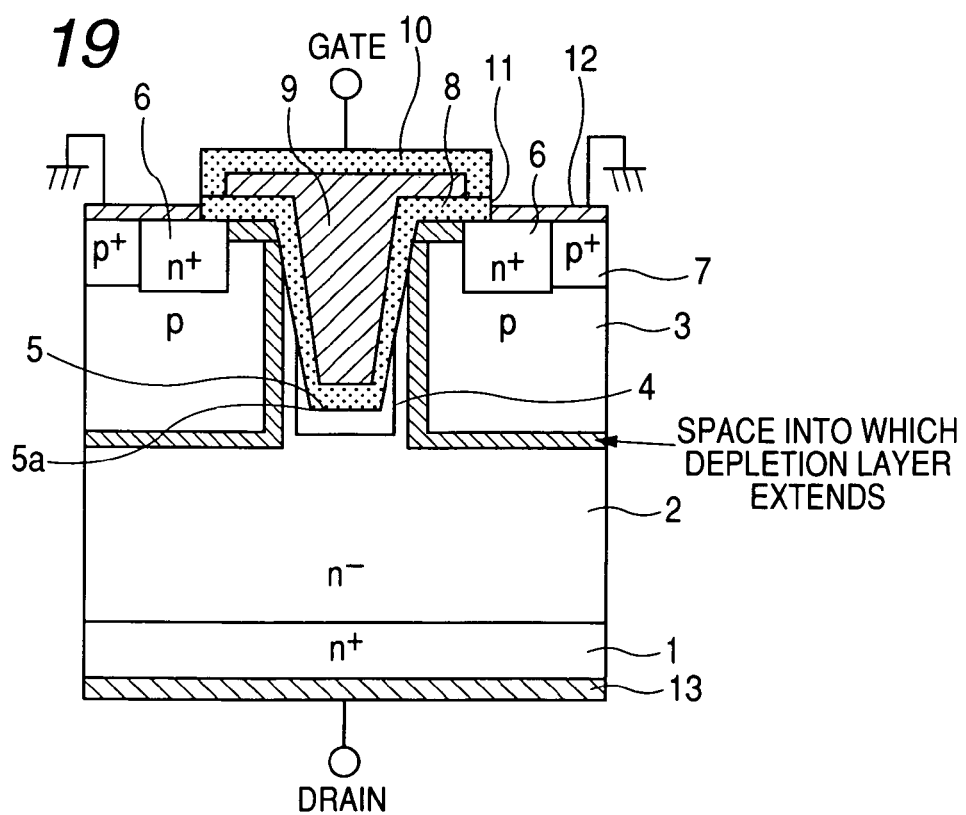
FIG. 19 is a diagram showing how a depletion layer extends, and showing equipotential lines in the MOSFET shown in FIG. 18 when it is in the off-state.
Figure 20:
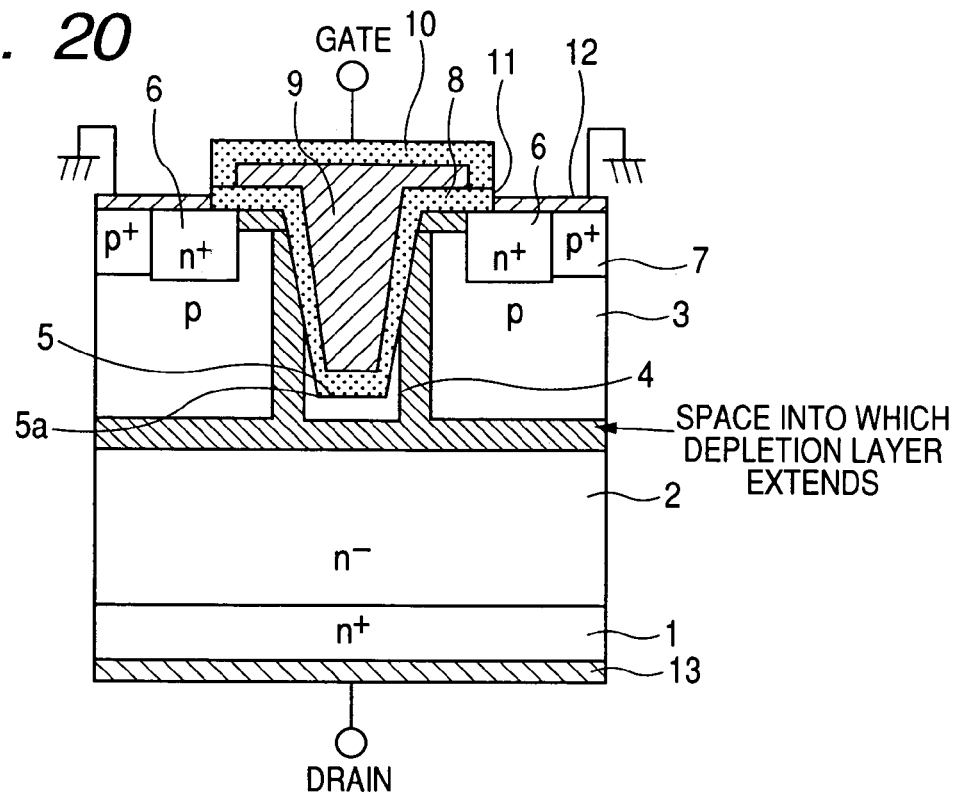
FIG. 20 is a diagram showing how a depletion layer extends in the MOSFET shown in FIG. 18 in case a high voltage is applied to the drain electrode when it is in the off-state.

FIG. 19 is a diagram showing how the depletion layer extends when the MOSFET of this embodiment is in the off-state, and FIG. 20 is a diagram showing how the depletion layer extends if a high voltage is applied to the drain electrode 13 when the MOSFET of this embodiment is in the off-state. In the following, the operation of the MOSFET of this embodiment is explained with reference to these FIGS. 19, and 20.

SiC posses an inherent potential of about 3 V when it has a high impurity concentration, for example, of 1×10¹⁹ cm⁻³. Accordingly, even when the voltage of the source electrode 12 is 0 V, each p-type base region behaves as if it is being applied with −3 V. Accordingly, as shown in FIG. 19, a depletion layer extends from each p-type base region 3, and the neighborhood of the p-type base region 3 behaves as if it is an insulator. In this case, even if a positive voltage is applied to the drain electrode 13, no current flows, because the surface channel layer 50 behaves as if it is an insulator, and accordingly, electrons cannot pass through the surface channel layer 50.

On the other hand, during the on period of the MOSFET when the voltage of the drain electrode 13 is 2 V, the voltage of the gate electrode 9 is 15 V, and the voltage of the source electrode 12 is 0 V, a channel region (accumulation layer) is set as a current path in the surface channel layer 50, and a current is passed between the n⁺-type source regions 6 and the n-type semiconductor layer 2, and accordingly the substrate 1 through this current path. At this time, since the distance W4 between the p-type base regions 3 and the p-type deep layer 4 is as large as, for example, 0.5 µm, the current path from the channel region to the n-type semiconductor layer 2 in this embodiment is wider than that in the third embodiment, and accordingly, the on-resistance is small compared to the third embodiment. A measurement shows that the on-resistance of the MOSFET of this embodiment is 2.8Ω·cm² which is smaller than that of the third embodiment by 0.5Ω·cm².

During the off period of the MOSFET, if a high voltage (1200 V, for example) is applied to the drain electrode 13 when the gate electrode 9 and the source electrode 12 are both at the potential of 0 V, a depletion layer extends from between each p-type base region 3 and the n-type semiconductor layer 2. At this time, since the impurity concentration of the p-type base regions 3 is much higher than that of the n-type semiconductor layer 2, the depletion layer extends virtually only towards the side of the n-type semiconductor layer 2 as shown in FIG. 20. The extension of the depletion layer when the high voltage is applied to the drain electrode 13 is greater than when the voltage of the drain electrode 13 is 0 V, and accordingly, the region behaving as an insulator further extends. As a result, this depletion layer connects to the depletion layer extending from the p-type deep layer 4, and developes a flat shape having no corner portions. A measurement shows that the drain withstand voltage is as high as 1320 V in this embodiment. Also in this embodiment, since the p-type deep layer 4 is formed so as to surround the bottom-surface and both the corner portions 5a of the trench 5, it is possible to suppress electric field concentration at the corner portions of the trench 5 below 1 MV/cm, to thereby prevent the gate oxidation film 8 from being broken.

Eighth Embodiment

Next, an eighth embodiment of the present invention is described. This embodiment is directed to a structure in which the structure of the fifth embodiment is applied to an inverted MOSFET. Since this embodiment is similar in basic structure to the first embodiment directed to an inverted MOSFET, the following description on the eighth embodiment focuses on the difference with the first embodiment.

Like the structure shown in FIGS. 12, 14, 16, also in the structure of an inverted MOEFET, deepening the p-type base regions 3 to reach below the trench 5 provides the above described advantages. In this case, if the corner portions 5a of the trench 5 can be surrounded by the depletion layer extending from each p-type base region 3, the p-type base regions 3 may or may not extend beneath the n-type channel layer 30. However, to make the depletion layer parallel to the substrate surface, it is desirable to adopt the structure described below.

Figure 21:
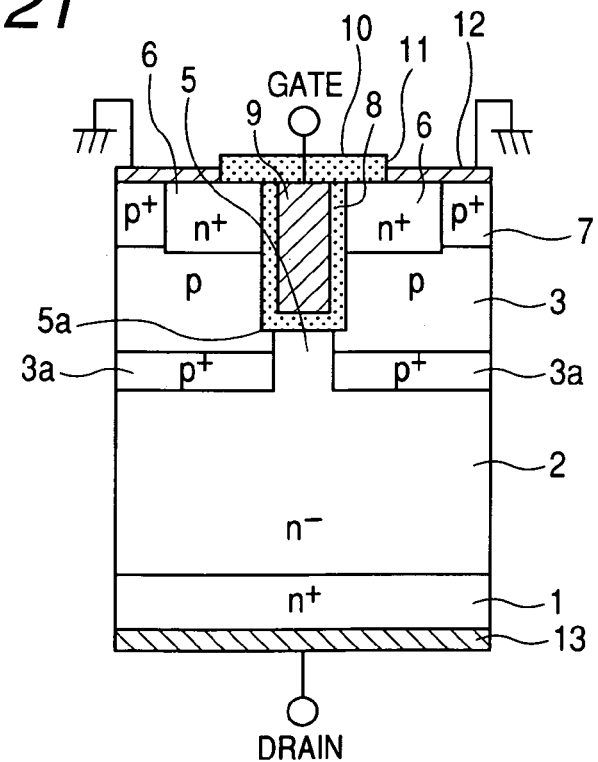
FIG. 21 is a cross-sectional view of an accumulation-mode MOSFET according to an eighth embodiment of the invention.
Figure 22:
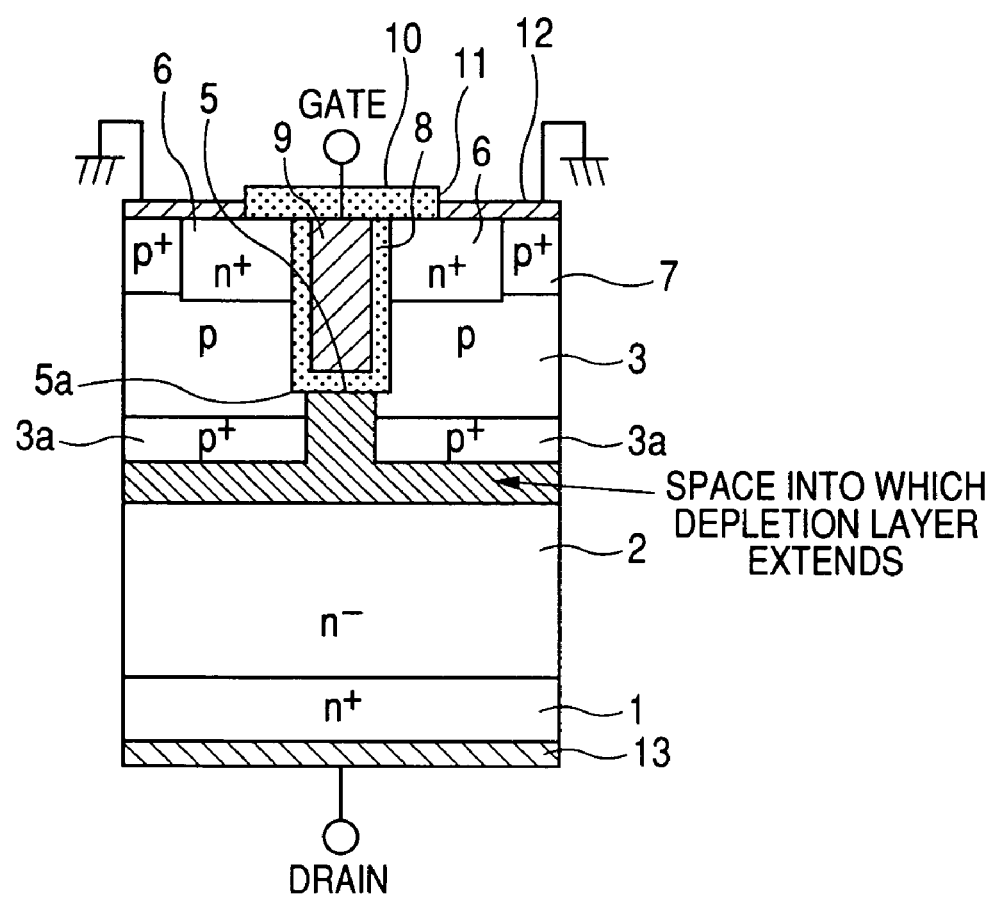
FIG. 22 is a diagram showing how a depletion layer extends, and showing equipotential lines in the MOSFET shown in FIG. 21 when it is in the off-state.

FIG. 21 is a cross-sectional view of an inverted MOSFET according to the eights embodiment. FIG. 22 is a diagram showing how a depletion layer extends, and showing equipotential lines in this MOSFET.

As shown in FIG. 21, a high concentration p+-type layer 3a is located beneath each p-type base region 3. The high concentration p+-type layer 3a is provided for extending the depletion layer into the n-type semiconductor layer 2. That is because, since the p-type base regions 3 have the low impurity concentration of about $1 \times 10^{17}$ cm$^{-3}$, the extension of the depletion layer extending from the boundary between each p-type base region and the n-type semiconductor layer 2 is small. Accordingly, the high concentration p+-type layer 3a more highly doped than the p-type base regions 3 is provided in order to increase the extension of the depletion layer extending into the n-type semiconductor layer 2. The high concentration p+-type layer 3a has an impurity concentration of from $1 \times 10^{18}$ cm$^{-3}$ to $3 \times 10^{19}$ cm$^{-3}$, for example, $1 \times 10^{19}$ cm$^{-3}$.

The trench 5 may have a shape in which the sidewall thereof is perpendicular to the substrate surface.

In the MOSFET of this embodiment, as shown in FIG. 22, the entire bottom portion of the trench 5 is surrounded by the depletion layer extending from the high concentration p+-type layer 3a when the MOSFET is in the off-state. Accordingly, also according to this embodiment, it is possible to suppress electric field concentration at the corner portions 5a of the trench 5, to thereby prevent the gate oxidation film 8 from being broken. A measurement shows that the drain withstand voltage is as high as 1320 V in this embodiment. Also, the on-resistance can be reduced to 3.0Ω·cm$^2$.

Other Embodiments

Although each of the above described embodiments has bee described with respect to the n-channel MOSFET, the present invention is applicable to a p-channel MOSFET.

In the first embodiment, the n+-type source regions 6 etc, are formed before forming the trench 5 as shown in FIG. 3. However, they may be formed after forming the trench 5 as shown in FIGS. 6 and 7 of the second embodiment. Conversely, in the second embodiment, although the n+-type source regions 6 etc, are formed after forming the trench 5 as shown in FIGS. 6 and 7, they may be formed before forming the trench 5 as shown in FIG. 3 of the first embodiment. It has been described with reference to FIGS. 3, 6, and 7, that the drain electrode 13 is formed preceding the formation of other components, however, it may be formed after the formation of other components.

The surface channel layer 50 described in the seventh embodiment may be used in the fourth, fifth, and sixth embodiments. In this case, the n+-type source regions 6 are formed so as to be completely surrounded by the p-type base regions 3, the n-type channel layer 30 is formed up to the substrate surface, and the surface channel layer 50 is formed on the surface of each p-type base region 3 located between the n+-type source region 6 and the n-type channel layer 30.

The above explained preferred embodiments are exemplary of the invention of the present application which is described solely by the claims appended below. It should be understood that modifications of the preferred embodiments may be made as would occur to one of skill in the art.

What is claimed is:

1. A silicon carbide semiconductor device including an inverted MOSFET comprising:
    a substrate of a first conductivity type, said substrate being made of silicon carbide;
    a drift layer of said first conductivity type formed on said substrate, said drift layer being made of silicon carbide, and less doped than said substrate;
    a trench formed from a surface of said drift layer;
    a pair of base regions of a second conductivity type formed so as to face across from said trench in said drift layer and be in contact with a sidewall of said trench, said base regions being made of silicon carbide;
    a pair of source regions of said first conductivity type formed so as to face across from said trench and be in contact with said sidewall of said trench in said drift layer, said source regions being made of silicon carbide, and more highly doped than said drift layer;
    a gate insulation film formed on a surface of said trench;
    a gate electrode formed on said gate insulation film within said trench;
    a first electrode electrically connected to said source regions;
    a second electrode formed on a back surface of said substrate;
    said inverted MOSFET operating such that a channel region is formed in a surface portion of each said base region located at said sidewall of said trench depending on a voltage applied to said gate electrode to allow a current to pass between said first and second electrodes through said source regions and said drift layer,
    wherein
    said trench is so shaped that said sidewall thereof is perpendicular to said surface of said drift layer, said base regions are made deeper than said trench, and bottom corners of said trench are surrounded by said base regions.

2. The silicon carbide semiconductor device according to claim 1, further comprising
    a high concentration layer of said second conductivity type formed beneath each said base region, said high concentration layer being more highly doped than said base regions.

* * * * *